(12) United States Patent
Tian et al.

(10) Patent No.: US 10,416,544 B2
(45) Date of Patent: Sep. 17, 2019

(54) LASER ARRAY, LASER LIGHT SOURCE AND LASER PROJECTION DEVICE

(71) Applicants: Qingdao Hisense Laser Display Co., Ltd., Qingdao, Shandong (CN); Hisense USA Corp., Suwanee, GA (US); Hisense International Co., Ltd., Qingdao, Shandong (CN)

(72) Inventors: Youliang Tian, Shandong (CN); Changming Jia, Shandong (CN)

(73) Assignees: Qingdao Hisense Laser Display Co., Ltd., Qingdao, Shandong (CN); Hisense USA Corp., Suwanee, GA (US); Hisense International Co., Ltd., Qingdao, Shandong (CN)

( * ) Notice: Subject to any disclaimer, the term of this patent is extended or adjusted under 35 U.S.C. 154(b) by 0 days.

(21) Appl. No.: 15/941,864

(22) Filed: Mar. 30, 2018

(65) Prior Publication Data

US 2019/0094673 A1 Mar. 28, 2019

(30) Foreign Application Priority Data

Sep. 26, 2017 (CN) .......................... 2017 1 0879671
Sep. 26, 2017 (CN) .......................... 2017 1 0879672
Sep. 26, 2017 (CN) .......................... 2017 1 0879799

(51) Int. Cl.
*G03B 21/20* (2006.01)
*H04N 9/31* (2006.01)
(Continued)

(52) U.S. Cl.
CPC ......... *G03B 21/2033* (2013.01); *G02B 27/48* (2013.01); *H01S 3/0007* (2013.01); *H01S 5/02288* (2013.01); *H01S 5/02292* (2013.01); *H01S 5/02469* (2013.01); *H01S 5/405* (2013.01); *H01S 5/4025* (2013.01); *H01S 5/4031* (2013.01); *H01S 5/4087* (2013.01);
(Continued)

(58) Field of Classification Search
CPC ............ G03B 21/2013; G03B 21/2033; H04N 9/3161; H04N 9/3164; H01L 25/0753; H01S 5/4025; H01S 5/405; H01S 5/42
USPC .......................................................... 313/500
See application file for complete search history.

(56) References Cited

U.S. PATENT DOCUMENTS 5,365,533 A * 11/1994 Groussin ................. H01L 27/15
257/745
9,209,605 B1* 12/2015 Guo ...................... H01S 5/4087
(Continued)

FOREIGN PATENT DOCUMENTS

CN       1071034 A    4/1993
CN       1249528 C    4/2006
(Continued)

OTHER PUBLICATIONS

Extended European Search Report for European Patent Application No. 18165123.3 dated Nov. 27, 2018; 11 pages.

*Primary Examiner* — Ryan D Howard
(74) *Attorney, Agent, or Firm* — Brinks Gilson & Lione (57) ABSTRACT

A laser array including at least one line of lasers. The at least one line of lasers includes a first laser and a second laser which are adjacent to each other. A first laser beam emitted by the first laser and a second laser beam emitted by the second laser are both in a first color, and the first laser beam has a wavelength less than that of the second laser beam.

19 Claims, 9 Drawing Sheets

(51) Int. Cl.
  *H01S 5/40* (2006.01)
  *G02B 27/48* (2006.01)
  *H01S 5/022* (2006.01)
  *H01S 5/024* (2006.01)
  *H01S 5/42* (2006.01)
  *H01S 3/00* (2006.01)
  *H01S 5/00* (2006.01)

(52) U.S. Cl.
  CPC ............ *H01S 5/42* (2013.01); *H04N 9/3161* (2013.01); *H04N 9/3164* (2013.01); *H01S 5/005* (2013.01); *H01S 5/02216* (2013.01); *H01S 5/02476* (2013.01); *H01S 5/4018* (2013.01); *H01S 5/4093* (2013.01)

(56) References Cited

U.S. PATENT DOCUMENTS

| | | |
|---|---|---|
| 2002/0110328 A1 | 8/2002 | Bischel et al. |
| 2004/0008744 A1 | 1/2004 | Okazaki et al. |
| 2004/0101008 A1 | 5/2004 | Kurtz et al. |
| 2004/0190573 A1 | 9/2004 | Kruschwitz et al. |
| 2005/0152146 A1* | 7/2005 | Owen ................. A61L 2/10 362/294 |
| 2007/0247709 A1* | 10/2007 | Karakawa ........ G02B 27/2207 359/464 |
| 2008/0175284 A1 | 7/2008 | Konttinen et al. |
| 2011/0063871 A1 | 3/2011 | Tanaka et al. |
| 2012/0320355 A1* | 12/2012 | Maeda ............... G03B 21/2013 355/67 |
| 2013/0243019 A1 | 9/2013 | Wakabayashi et al. |
| 2014/0029638 A1 | 1/2014 | Welford et al. |
| 2014/0036943 A1* | 2/2014 | Janssens .............. H01S 3/10061 372/27 |
| 2014/0177662 A1 | 6/2014 | Asano |

FOREIGN PATENT DOCUMENTS

| | | |
|---|---|---|
| CN | 101144876 A | 3/2008 |
| CN | 103311806 A | 9/2013 |
| JP | 2011-049338 A | 3/2011 |

\* cited by examiner

LASER ARRAY, LASER LIGHT SOURCE AND LASER PROJECTION DEVICE

CROSS-REFERENCE TO RELATED APPLICATION(S)

The application claims the priority to Chinese Patent Application No. 201710879672.8 filed on Sep. 26, 2017 and entitled "LASER ARRAY AND LASER LIGHT SOURCE", Chinese Patent Application No. 201710879671.3 filed on Sep. 26, 2017 and entitled "LASER ARRAY", and Chinese Patent Application No. 201710879799.X filed on Sep. 26, 2017 and entitled "LASER ARRAY", the entirety of all of which are hereby incorporated by reference herein.

TECHNICAL FIELD

The present disclosure relates to the technical field of laser display, and in particular to a laser array, a laser light source and a laser projection device.

BACKGROUND

Usually, lasers include solid lasers, gas lasers, liquid lasers, semiconductor lasers, etc. Semiconductor lasers are also called semiconductor laser diodes which are usually applied to optical communication, information storage and processing, laser printing, etc., due to their advantages of small volume, high efficiency and long service life.

SUMMARY

Some embodiments of the present disclosure provide a laser array comprising at least one line of lasers, the at least one line of lasers comprising a first laser and a second laser which are adjacent, wherein a first laser beam emitted by the first laser and a second laser beam emitted by the second laser are both in a first color, and the first laser beam has a wavelength less than that of the second laser beam.

Some embodiments of the present disclosure provide a laser light source comprising: a laser array, comprising at least one line of lasers, wherein the at least one line of lasers comprises a first laser and a second laser which are adjacent, a first laser beam emitted by the first laser and a second laser beam emitted by the second laser are both in a first color, and the first laser beam has a wavelength less than that of the second laser beam; at least one collimating lens set configured to collimate, as a collimated laser beam, laser beam emitted by the laser array; and at least one converging lens set configured to converge the collimated laser beam.

Some embodiments of the present disclosure provide a laser projection device, comprising: a laser light source; an imaging element configured to receive a laser beam emitted by the laser light source and generate a projection light beam according to a received video signal; a projection lens configured to project the projection light beam onto a display surface to display an image, wherein, the laser light source comprises: a laser array, comprising at least one line of lasers, wherein the at least one line of lasers comprises a first laser and a second laser which are adjacent, a first laser beam emitted by the first laser and a second laser beam emitted by the second laser are both in a first color, and the first laser beam has a wavelength less than that of the second laser beam; at least one collimating lens set configured to collimate, as collimated laser beams, laser beams emitted from the laser array; and at least one converging lens set configured to converge the collimated laser beams.

BRIEF DESCRIPTION OF THE DRAWINGS

To describe the technical solutions in the embodiments of the present disclosure more clearly, the accompanying drawings to be used in the description of the embodiments will be briefly described below. Apparently, the accompanying drawings described hereinafter are some of the embodiments of the present disclosure, and a person of ordinary skill in the art can acquire other accompanying drawings according to these drawings without paying any creative effort.

DETAILED DESCRIPTION

The technical solutions in the embodiments of the present disclosure will be clearly and completely described below with reference to the accompanying drawings in the embodiments of the present disclosure. Apparently, the embodiments described herein are merely a part but not all of the embodiments of the present disclosure. All other embodiments obtained by a person of ordinary skill in the art without paying any creative effort on the basis of the embodiments in the present disclosure shall fall into the protection scope of the present disclosure.

It should be understood that, unless otherwise specified, terms and expressions as used herein have usual meanings the same as the corresponding research and research fields. Related terms, for example, first and second, and similar terms are merely used for distinguishing one from another entity or function, and it does not require or imply any practical such relation or order between such entities or functions. Terms "includes", "including" or any other variations thereof are intended to cover a non-exclusive inclusion, so that a process, method, article or device including a list of elements includes other elements not explicitly listed by or inherent to this process, method, article or device in addition to those listed elements.

Unless otherwise further limited, "an element" does not exclude that there is other same elements in a process, method, article or device including this element. Unless otherwise stated, in the description of the present disclosure, "a plurality of" means two or more.

In recent years, lasers have been gradually applied in the technical of projected display as a light source. However, due to the high coherence of laser beams, the speckle effect may occur. The so-called speckle means that the scattered light results in interference in a space due to the same wavelength and constant phase when a rough object is exposed to coherent light sources. Constructive interference occurs in a part of the space while destructive interference occurs in another part of the space. Eventually, granular dark-bright spots appear on the display side. As a result, the quality of projected images is deteriorated.

In the related technologies, to reduce the speckle effect caused by the inherent characteristics of laser beams, a rotary or vibratory scatter sheet is used or a diffuser component is arranged in the laser beam propagation path to increase the spatial phase of laser beams, so as to damage the constant phase condition for interference to weaken the speckle effect. There are some other methods which weaken the speckle effect by vibrating optical fibers, a screen, etc. However, by those methods, only the spatial coherence of laser beams can be reduced and then averaged in time. Since laser beam itself has ultrahigh temporal coherence, the speckle cancellation measures taken in the related technologies only with respect to the spatial coherence of laser beams are highly limited and greatly hinder the solution of the speckle problem of laser display.

Figure 1:
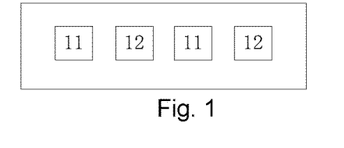
FIG. 1 shows a schematic view of a laser array according to some embodiments of the present disclosure.

In view of those problems, some embodiments of the present disclosure provide a laser array. As shown in FIG. 1, the laser array includes at least one line of lasers, and the at least one line of lasers include a first laser 11 and a second laser 12 which are adjacent. A first laser beam emitted by the first laser 11 and a second laser beam emitted by the second laser 12 are both in a first color. The first laser beam has a wavelength less than that of the second laser beam.

It will be noted that the wavelength of the laser beam referred in the embodiments of the present disclosure and compared with another wavelength is a dominant wavelength of the laser beam.

In some embodiments, the laser is selected from a group consisting of solid lasers, gas lasers, liquid lasers and semiconductor lasers. In other embodiments, the laser is other lasers applied in light sources.

By setting two adjacent lasers in different emission wavelengths, the temporal coherence of laser beams emitted by two adjacent lasers may be reduced. Furthermore, by setting two adjacent lasers in different emission wavelengths, two lasers in a same emission wavelength may be separated by a laser in a different emission wavelength, so that the temporal coherence of laser beams emitted by the two lasers may be reduced. In conclusion, the speckle effect of laser beams may be reduced and the quality of display may be improved.

In some embodiments, one line is a line in the form of a straight line. In other embodiments, one line is a line composed of non-intersected curves, and the curves are, for example, S-shaped curves or annular curves.

In some embodiments, the laser array contains at least one group, and the at least one group contains lasers which are adjacent in position. Laser beams emitted by lasers, which are adjacent in position and emit laser beams in a same color, in a same group have different wavelengths.

In some embodiments, the laser array contains at least two groups which are adjacent in position, and in two groups which are adjacent in position, laser beams emitted by lasers, which are adjacent in position and emit laser beams in a same color, have different wavelengths.

Figure 4:
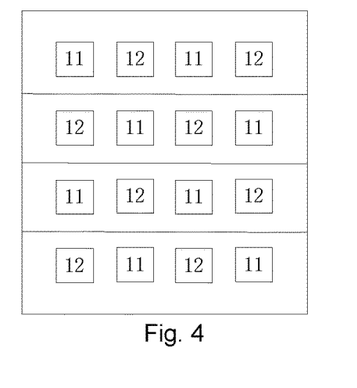
FIG. 4 shows a schematic view of a laser array emitting light in a single color according to some embodiments of the present disclosure.

In some embodiments, as shown in FIG. 1, the laser array includes one line of lasers. For example, the line of lasers includes a first laser 11 and a second laser 12 which are adjacent. In other embodiments, as shown in FIG. 4, the laser array includes at least two lines of lasers. The at least two lines of lasers include a first laser 11 and a second laser 12 which are adjacent. In some examples, the first laser 11 and the second laser 12 are in a same row. In other examples, the first laser 11 and the second laser 12 are in a same column.

In some embodiments, as shown in FIG. 4, the first laser 11 and the second laser 12 are included in one line of the at least one line of lasers. The one line of lasers includes at least one first laser 11 and at least one second laser 12. In some examples, the at least one first laser 11 and the at least one second laser 12 are alternatively arranged. That is, at respective positions adjacent to the first laser 11 and the second laser 12, lasers respectively different from the first laser 11 and the second laser 12 are arranged. Thus, the arrangement of a different laser between identical lasers can be realized. In other examples, the one line of lasers includes a plurality of first lasers 11 and a plurality of second lasers 12, and at least some of the plurality of first lasers 11 and at least some of the plurality of second lasers 12 are alternatively arranged.

In some embodiments, the first color includes one of blue, red or green. In other embodiments, the first color is other colors by which lasers can be applied to laser light sources. As shown in FIG. 4, the colors of laser beams emitted by the first laser 11 and the second laser 12 are blue.

Figure 3:
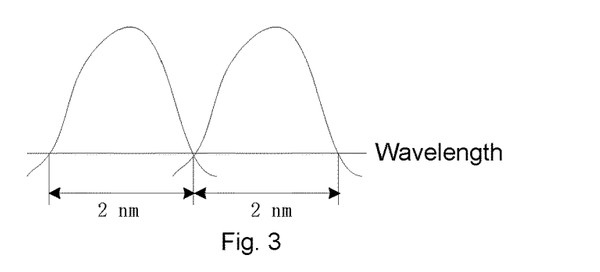
FIG. 3 shows a schematic view of spectral width of laser beam emitted by a laser according to some embodiments of the present disclosure.

In some embodiments, the first laser beam has a wavelength at least 1 mm less than that of the second laser beam. Since the spectral width of laser beam emitted by a semiconductor laser is about 2 nm (as shown in FIG. 3), the space between the central spectra of two adjacent laser beams (i.e., first laser beam and second laser beam) is designed to be above 1 nm. The temporal coherence of two adjacent laser beams may be reduced, and the speckle effect of the laser beams may be thus reduced. In other embodiments, the first laser beam has a wavelength at least 2 mm less than that of the second laser beam. Therefore, the temporal coherence of two adjacent laser beams may be further reduced, and the speckle effect of the laser beams may be thus reduced.

Figure 2:
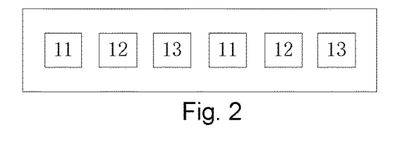
FIG. 2 shows a schematic view of another laser array according to some embodiments of the present disclosure.

In some embodiments of the present disclosure, as shown in FIG. 2, the line of lasers further includes at least one third laser 13. A third laser beam emitted by the third laser 13 is in a same color as the first laser beam and the second laser beam, and the third laser beam has a wavelength greater than that of the second laser beam. The at least one first laser 11, the at least one second laser 12 and at least one the third laser 13 are alternatively arranged.

The arrangement that the at least one first laser 11, the at least one second laser 12 and the at least one third laser 13 are alternatively arranged can be that, at respective positions adjacent to the first laser 11, the second laser 12 and the third laser 13, lasers respectively different from the first laser 11, the second laser 12 and the third laser 13 are arranged. As shown in FIG. 2, two first lasers 11, two second laser 12 and two third lasers 13 are located in a same row, a first laser 11 of them is adjacent to a second laser 12 of them, the second laser 12 is adjacent to a third laser 13 of them, and the third laser 13 is adjacent to another first laser 11 of them.

In some embodiments, the third laser beam has a wavelength at least 1 nm greater than that of the second laser beam. In such an arrangement, two adjacent laser beams can have different wavelengths, so that the temporal coherence of two adjacent laser beams may be reduced, and the speckle effect of the laser beams may be thus reduced. In other embodiments, the third laser beam has a wavelength at least 2 nm greater than that of the second laser beam. In such an arrangement, the temporal coherence of two adjacent laser beams may be further reduced, and the speckle effect of the laser beams may be thus reduced.

In some embodiments, the spectral width of each of laser beams, in a same color, output by lasers in different wavelength is not greater than half of the spectral width of this color, so that the eventually output different colors may form a high color gamut.

In some embodiments of the present disclosure, the at least one line of lasers further includes a fourth laser 14 and a fifth laser 15 which are adjacent. A fourth laser beam emitted by the fourth laser 14 and a fifth laser beam emitted by the fifth laser 15 are both in a second color. The second color is different from the first color. The fourth laser beam has a wavelength less than that of the fifth laser beam.

Figure 5:
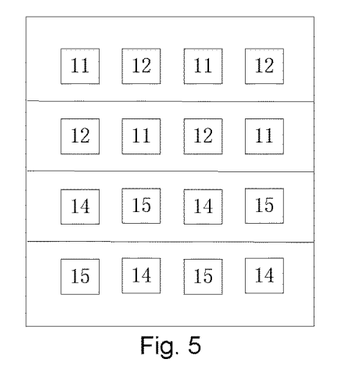
FIG. 5 shows a schematic view of a laser array emitting light in two colors according to some embodiments of the present disclosure.
Figure 6:
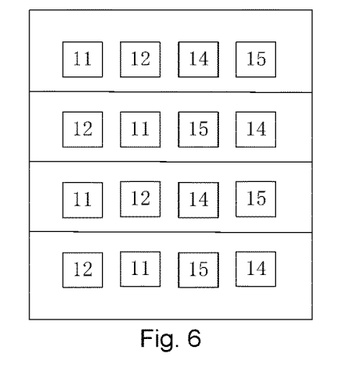
FIG. 6 shows a schematic view of another laser array emitting light in two colors according to some embodiments of the present disclosure.
Figure 7:
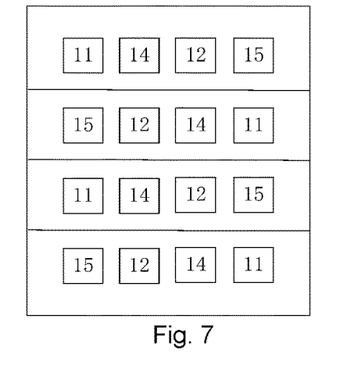
FIG. 7 shows a schematic view of still another laser array emitting light in two colors according to some embodiments of the present disclosure.

In some embodiments, the laser array comprises one line of lasers. The line of lasers include a first laser 11 and a second laser 12 which are adjacent, and a fourth laser 14 and a fifth laser 15 which are adjacent. In other embodiments, the laser array includes at least two lines of lasers, and the at least two lines of lasers include a first laser 11 and a second laser 12 which are adjacent, and a fourth laser 14 and a fifth laser 15 which are adjacent. As shown in FIG. 5, the laser array includes four rows of lasers. First lasers 11 and second lasers 12 are arranged in the upper two rows while fourth lasers 14 and fifth lasers 15 are arranged in the lower two rows. In some embodiments, as shown in FIG. 6, in a row, a first laser 11 is adjacent to a second laser 12, the second laser 12 is adjacent to a fourth laser 14, and the fourth laser 14 is adjacent to a fifth laser 15. In a column, first lasers 11 and second lasers 12 are alternatively arranged, or, fourth lasers 14 and fifth lasers 15 are alternatively arranged. In some embodiments, as shown in FIG. 7, in a row, a first laser 11 is adjacent to a fourth laser 14, the fourth laser 14 is adjacent to a second laser 12, and the second laser 12 is adjacent to a fifth laser 15. In a column, first lasers 11 and fifth lasers 15 are alternatively arranged, or, second lasers 12 and fourth lasers 14 are alternatively arranged. The arrangement of the first lasers 11, the second lasers 12, the fourth lasers 14 and the fifth lasers 15 is not limited in the present disclosure.

In some embodiments, the second color includes one of blue, red or green, and is different from the first color. For example, as shown in FIG. 5 to FIG. 7, the first color is blue, that is, the first lasers 11 and the second lasers 12 emit blue laser beams; and the second color is red, that is, the fourth lasers 14 and the fifth lasers 15 emit red laser beams. In this case, the laser array emits light in two colors. In other embodiments, the second color is other colors by which lasers can be applied to laser light sources and which are different from the first color.

In some embodiments, the fourth laser beam has a wavelength at least 1 mm less than that of the fifth laser beam. Since the spectral width of laser beam emitted by a semiconductor laser is about 2 nm (as shown in FIG. 3), the space between the central spectra of two adjacent laser beams (i.e., fourth laser beam and fifth laser beam) is designed to be above 1 nm. The temporal coherence of two adjacent laser beams may be reduced, and the speckle effect of the laser beams may be thus reduced. In some embodiments, the fourth laser beam has a wavelength at least 2 mm less than that of the fifth laser beam. Therefore, the temporal coherence of two adjacent laser beams may be further reduced, and the speckle effect of the laser beams may be thus reduced.

Figure 8:
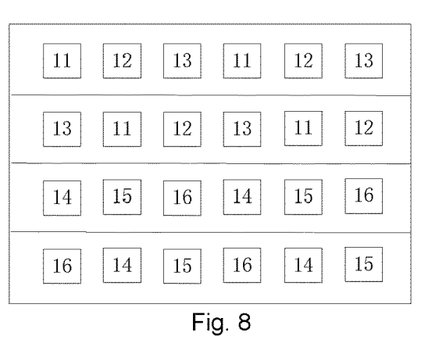
FIG. 8 shows a schematic view of yet another laser array emitting light in two colors according to some embodiments of the present disclosure.

In some embodiments of the present disclosure, the fourth laser 14 and the fifth laser 15 are arranged in one line of the at least one line of lasers, and the one line of lasers includes at least one fourth laser 14 and at least one fifth laser 15. In some examples, the at least one fourth laser 14 and the at least one fifth laser 15 are alternatively arranged. That is, at respective positions adjacent to the fourth laser 14 and the fifth laser 15, lasers respectively different from the fourth laser 14 and the fifth laser 15 are arranged. Thus, the arrangement of at least one different laser between identical lasers may be realized. In other examples, the one line of lasers comprises a plurality of fourth lasers 14 and a plurality of fifth lasers 15, and at least some of the plurality of fourth lasers 14 and at least some of the plurality of fifth lasers 15 are alternatively arranged. In some embodiments of the present disclosure, as shown in FIG. 8, the line of lasers further includes at least one sixth laser 16. A sixth laser beam emitted by the sixth laser 16 is in the second color, and has a wavelength greater than that of the fifth laser beam. The at least one sixth laser 16, the at least one fourth laser 14 and the at least one fifth laser 15 are alternatively arranged.

The arrangement that the at least one sixth laser 16, the at least one forth laser and the at least one fifth laser 15 are alternatively arranged can be that, at respective positions adjacent to the sixth laser 16, the fourth laser and the fifth laser 15, lasers respectively different from the sixth laser 16, the fourth laser and the fifth laser 15 are arranged. For example, as shown in FIG. 8, two fourth lasers 14, two fifth lasers 15 and two sixth lasers 16 are located in a same row, a fourth laser 14 of them is adjacent to a fifth laser 15 of them, the fifth laser 15 is adjacent to a sixth laser 16 of them, and the sixth laser 16 is adjacent to another fourth laser 14 of them.

In some embodiments, the sixth laser beam has a wavelength at least 1 nm greater than that of the fifth laser beam. In such an arrangement, two adjacent laser beams have different wavelengths, so that the temporal coherence of two adjacent laser beams may be reduced, and the speckle effect of the laser beams may be thus reduced. In some embodiments, the sixth laser beam has a wavelength at least 2 nm greater than that of the fifth laser beam. In such an arrangement, the temporal coherence of two adjacent laser beams may be further reduced, and the speckle effect of the laser beams may be thus further reduced.

In some embodiments, the sixth laser 16 is adjacent to the first laser 11, the second laser 12, the third laser 13, the fourth laser 14 or the fifth laser 15.

In some embodiments of the present disclosure, the at least one line of lasers further includes a seventh laser 17 and an eighth laser 18 which are adjacent. A seventh laser beam emitted by the seventh laser 17 and an eighth laser beam emitted by the eighth laser 18 are both in a third color. The third color is different from the first color and the second color. The seventh laser beam has a wavelength less than that of the eighth laser beam. In some examples, the at least one line of lasers includes at least one first laser 11, at least one second laser 12, at least one fourth laser 14, at least one fifth laser 15, at least one seventh laser 17 and at least one eighth laser 18.

Figure 9:
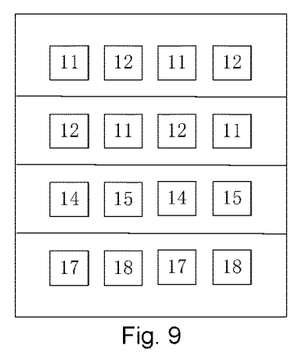
FIG. 9 shows a schematic view of a laser array emitting light in three colors according to some embodiments of the present disclosure.

In some embodiments, the laser array includes one line of lasers. For example, the line of lasers includes a first laser 11 and a second laser 12 which are adjacent, a fourth laser 14 and a fifth laser 15 which are adjacent, and a seventh laser 17 and an eighth laser 18 which are adjacent. In other embodiments, the laser array includes at least two lines of lasers. For example, the at least two lines of lasers include a first laser 11 and a second laser 12 which are adjacent, a fourth laser 14 and a fifth laser 15 which are adjacent, and a seventh laser 17 and an eighth laser 18 which are adjacent. For example, as shown in FIG. 9, the laser array includes four lines of lasers. First lasers 11 and second lasers 12 are alternatively arranged in the upper two rows. Fourth lasers 14 and fifth lasers 15 are alternatively arranged in the third row. Seventh lasers 17 and eighth lasers 18 are alternatively arranged in the fourth row. The arrangement of the first lasers 11, the second lasers 12, the fourth lasers 14, the fifth lasers 15, the seventh lasers 17 and the eighth lasers 18 is not limited in the present disclosure.

In some embodiments, the third color includes one of blue, red or green, and is different from the first color and the second color. For example, as shown in FIG. 9, the first color is blue, that is, the first lasers 11 and the second lasers 12 emit blue laser beams; the second color is red, that is, the fourth lasers 14 and the fifth lasers 15 emit red laser beams; and the third color is green, that is, the seventh lasers 17 and the eighth lasers 18 emit green laser beams. In this case, the laser array emits light in three colors. In other embodiments, the third color is other colors by which lasers can be applied to laser light sources and which are different from the first color and the second color.

In some embodiments, the seventh laser beam has a wavelength at least 1 mm less than that of the eighth laser beam. Since the spectral width of laser beam emitted by a semiconductor laser is about 2 nm (as shown in FIG. 3), the space between the central spectra of two adjacent laser beams (i.e., seventh laser beam and eighth laser beam) is designed to be above 1 nm. The temporal coherence of two adjacent laser beams may be reduced, and the speckle effect of the laser beams may be thus reduced. In some embodiments, the seventh laser beam has a wavelength at least 2 mm less than that of the eighth laser beam. Therefore, the temporal coherence of two adjacent laser beams may be further reduced, and the speckle effect of the laser beams may be thus further reduced.

Figure 10:
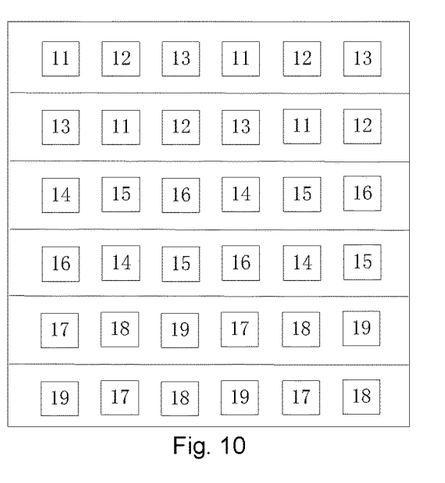
FIG. 10 shows a schematic view of another laser array emitting light in three colors according to some embodiments of the present disclosure.

In some embodiments of the present disclosure, the seventh laser 17 and the eighth laser 18 are arranged in one line of the at least one line of lasers, and the one line of lasers includes at least one seventh laser 17 and at least one eighth laser 18. In some examples, the at least one seventh laser 17 and the at least one eighth laser 18 are alternatively arranged. That is, at respective positions adjacent to the seventh laser 17 and the eighth laser 18, lasers respectively different from the seventh laser 17 and the eighth laser 18 are arranged. Thus, the arrangement of at least one different laser between identical lasers may be realized. In other examples, the one line of lasers includes a plurality of seventh lasers 17 and a plurality of eighth lasers 18, and at least some of the plurality of seventh lasers 17 and at least some of the plurality of eighth lasers 18 are alternatively arranged. In some embodiments of the present disclosure, as shown in FIG. 10, the line of lasers further includes at least one ninth laser 19. A ninth laser beam emitted by the ninth laser 19 is in the third color, and the ninth laser beam has a wavelength greater than that of the eighth laser beam. The at least one ninth laser 19, the at least one seventh laser 17 and the at least one eighth laser 18 are alternatively arranged.

The arrangement that the at least one ninth laser 19, the at least one seventh laser 17 and the at least one eighth laser 18 are alternatively arranged can be that, at respective positions adjacent to the ninth laser 19, the seventh laser 17 and the eighth laser 18, lasers respectively different from the ninth laser 19, the seventh laser 17 and the eighth laser 18. For example, as shown in FIG. 9, two seventh lasers 17, two eighth lasers 18 and two ninth lasers 19 are located in a same row, a seventh laser 17 of them is adjacent to an eighth laser 18 of them, the eighth laser 18 is adjacent to a ninth laser 19 of them, and the ninth laser 19 is adjacent to another seventh laser 17 of them.

In some embodiments, the ninth laser beam has a wavelength at least 1 nm greater than that of the eighth laser beam. In such an arrangement, two adjacent laser beams have different wavelengths, so that the temporal coherence of two adjacent laser beams may be reduced, and the speckle effect of the laser beams may be thus reduced. In some embodiments, the ninth laser beam has a wavelength at least 2 nm greater than that of the eighth laser beam. In such an arrangement, the temporal coherence of two adjacent laser beams may be further reduced, and the speckle effect of the laser beams may be thus further reduced.

In some embodiments, the ninth laser 19 is adjacent to the first laser 11, the second laser 12, the third laser 13, the fourth laser 14, the fifth laser 15, the sixth laser 16, the seventh laser 17 or the eighth laser 18.

In some embodiments, the at least one line of lasers includes at least two lines of lasers, with an interval of 3 mm to 10 mm between two adjacent lines of lasers. For example, as shown in FIG. 10, the at least one line of lasers includes sixth lines of lasers, with an interval of 3 mm to 10 mm between two adjacent lines of lasers. In such an arrangement, the interference of laser beams may be avoided between two adjacent lines of lasers, and a small volume of the laser array may be ensured.

In some embodiments of the present disclosure, the lasers in the laser array are semiconductor lasers which include light-emitting chips. The light-emitting chips emit laser beams.

The laser array according to embodiments of the present disclosure will be further described by taking a semiconductor laser being a laser as example.

Semiconductor lasers are also called laser diodes which have advantages of small volume, high efficiency and long service life. The semiconductor lasers have been widely applied to optical communication, information storage and processing, military applications, medical applications, laser printing, measurement and survey radars since they can be adjusted by a simple current injection way.

In the related technologies, the semiconductor lasers are packaged by a TO (Transistor Outline). The TO is first defined as transistor package, and then eventually transformed to a concept of packaging, i.e., totally-enclosed packaging which is a commonly used packaging method for microelectronic devices. The TO for semiconductor lasers usually consists of a housing, a tongue and pins. The tongue is usually arranged on the housing and has a light-emitting chip bonded thereon, and a packaging cap is covered on the tongue. Such a packaging way can lead heat in the laser chips to the TO tube socket by the TO-tongue and then to dedicated heat dissipation supported by the TO tube socket.

Figure 11:
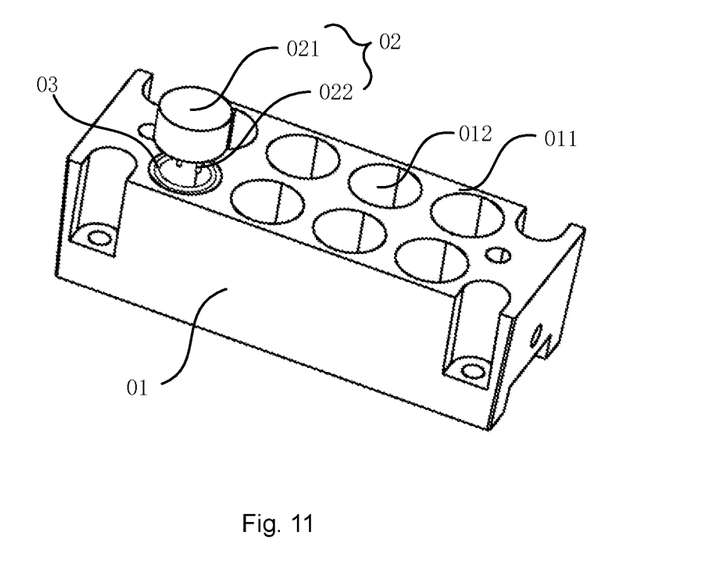
FIG. 11 shows a structure diagram of packaging of a laser array.

FIG. 11 shows a TO laser array in the related technologies. The TO laser array includes TO lasers and a support. The support 01 is provided with multiple mounting grooves 011, in which the TO lasers are mounted, and each of bottom surfaces of the mounting grooves 011 is provided with through holes 012. The TO laser 02 includes a housing 021 and pins 022 which can pass through the through holes 012 of the mounting groove 011 respectively. When the TO laser 02 is fixed, a ring made of tin 03 is provided between the mounting groove 011 and the TO laser 02, the ring made of tin 03 is then heated to be molten, and further, the TO laser 02 is fixed to the bottom surface of the mounting groove 011 by welding. In this way, heat from the TO may be further lead to the support 01 for heat dissipation, and the TO may be also fixed.

However, in the related technologies, in order to realize dissipation of heat from the light-emitting chip in the laser, it is necessary to design a dedicated TO and a corresponding support. As a result, the heat dissipation path is complex and the process is complicated. Consequently, the heat dissipation efficiency is low.

Figure 12:
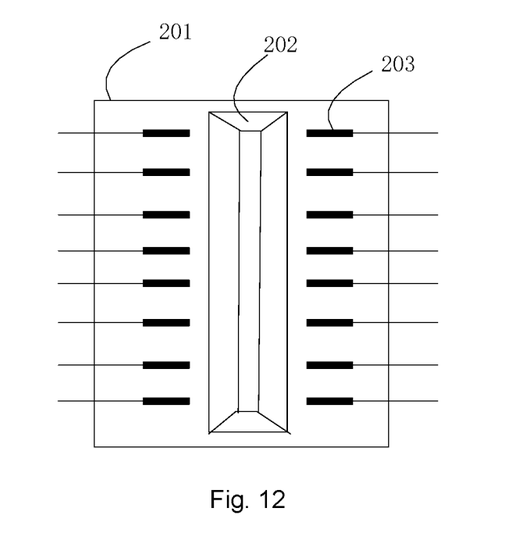
FIG. 12 shows a schematic structure diagram of a laser array according to some embodiments of the present disclosure.

To improve the heat dissipation efficiency, in some embodiments of the present disclosure, as shown in FIG. 12, the laser array includes a metal substrate 201, a reflective protrusion 202 and at least one laser, and the at least one laser includes at least six light-emitting chips 203. The reflective protrusion 202 and the at least six light-emitting chips 203 are fixedly connected to the metal substrate 201. There is an interval of 1 mm to 10 mm between two adjacent light-emitting chips 203. Each of the light-emitting chips 203 is configured to emit light towards the reflective protrusion 202, and the reflective protrusion 202 is configured to reflect the light emitted by the light-emitting chips 203 and make the reflected light face away from the metal substrate 201.

It will be noted that although the laser array is described by taking semiconductor lasers including light-emitting chips as example in the embodiments of the present disclosure, the lasers having light-emitting devices in the laser array are not limited to semiconductor lasers and the light-emitting devices are not limited to light-emitting chips. For example, lasers in the laser array are lasers which have light-emitting chips 103 or have other light-emitting devices having a same function as the light-emitting chips, except for semiconductor lasers.

The number of light-emitting chips is not specifically limited, and may be increased or reduced according to the requirement on the light-emitting brightness. The way of fixed connection of the light-emitting chips 203 and the metal substrate 201 is not specifically limited as long as this connection way will not significantly influence the heat conduction. In some examples, the light-emitting chips 203 and the metal substrate 201 are fixed by welding. In some other examples, the light-emitting chips 203 and the metal substrate 201 are fixed by bonding by using a thermal conductive adhesive. In some embodiments of the present disclosure, the metal substrate is a copper substrate having a thickness of 1 mm to 3 mm.

By directly connecting the light-emitting chips 203 with the metal substrate 201 showing efficient heat dissipation performance and setting the interval between two adjacent light-emitting chips 203 to be 1 mm to 10 mm, heat generated by the light-emitting chips may be quickly transferred and dissipated while ensuring the light-emitting brightness of the lasers. Furthermore, the production process of the laser array may be simplified, and the production cost may be thus reduced.

Figure 13:
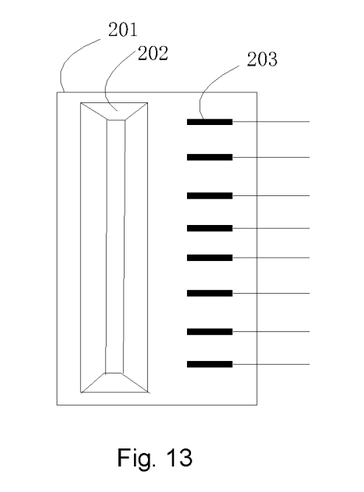
FIG. 13 shows a schematic structure diagram of another laser array according to some embodiments of the present disclosure.
Figure 14:
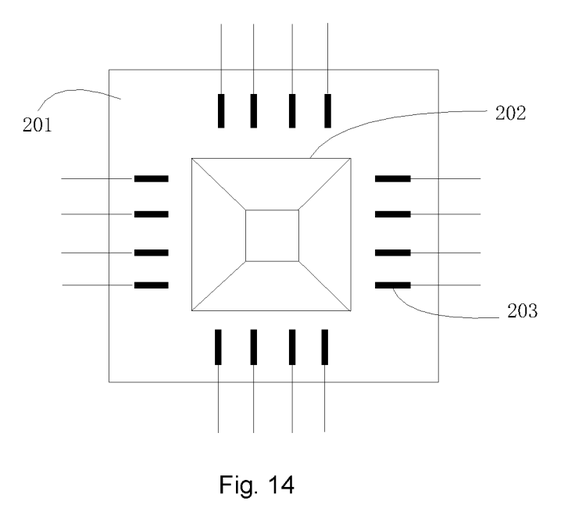
FIG. 14 shows a schematic structure diagram of yet another laser array according to some embodiments of the present disclosure.

The reflective protrusion 202 in the laser array has various reflection ways. Meanwhile, the arrangement of the light-emitting chips varies according to different reflection ways of the reflective protrusion 202. In some examples, as shown in FIG. 12, the reflective protrusion 202 has two reflective surfaces, and the light-emitting chips 203 are arranged at two sides of the reflective protrusion 202 corresponding to the two reflective surfaces respectively. For example, the reflective protrusion 202 has two opposite inclined reflective surface. The light-emitting chips 203 at the two sides emit light beams, which are parallel to the metal substrate 201, onto the inclined reflective surfaces, and the light beams are reflected by the inclined reflective surfaces with their emission direction being changed. For example, by the inclined reflective surfaces, the light beams are emitted in a direction away from and perpendicular to the metal substrate 201. In other examples, as shown in FIG. 13, the reflective protrusion 202 has only one reflective surface, the light-emitting chips 203 are arranged at one side of the reflective protrusion 202 corresponding to the one reflective surface. For example, the reflective protrusion 202 has one inclined reflective surface. The light-emitting chips 203 emit light beams, which are parallel to the metal substrate 201, onto the inclined reflective surface, and the light beams are reflected by the inclined reflective surface with their emission direction being changed. For example, by the inclined reflecting surface, the light beams are emitted in a direction away from and perpendicular to the metal substrate 201. In further embodiments, as shown in FIG. 14, the reflective protrusion 202 has four reflective surfaces, and the light-emitting chips 203 are arranged at four sides of the reflective protrusion 202 corresponding to the four reflective surfaces respectively. For example, the reflective protrusion 202 has four inclined reflective surface. The light-emitting chips 203 at the four sides emit light beams, which are parallel to the metal substrate 201, onto the inclined reflecting surfaces, and the light beams are reflected by the inclined reflecting surfaces with their emission direction being changed. For example, by the inclined reflecting surfaces, the light beams are emitted in a direction away from and perpendicular to the metal substrate 201.

Figure 15:
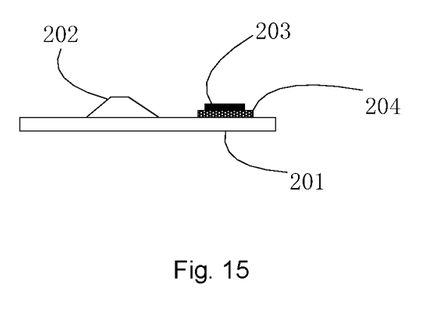
FIG. 15 shows a cross-sectional view of a laser array according to some embodiments of the present disclosure.

In some embodiments of the present disclosure, as shown in FIG. 15, the laser array further includes a heat sink 204 by which the light-emitting chips 203 are fixedly connected to the metal substrate 201. For example, first, the light-emitting chips 203 are fixedly connected to one surface of the heat sink 204 by welding or by bonding by using a thermal conductive adhesive, and then an opposite surface of the heat sink 204 is fixedly connected to the metal substrate 201 by welding or by bonding by using a thermal conductive adhesive. The emission direction of the light-emitting chips 203 is aligned to the reflective surface of the reflective protrusion 202. The heat sink is made of, for example, AlN or SiC or the like. Since a large amount of heat will be generated when the light-emitting chips operate so that the light-emitting chips themselves will expand with heat, if the light-emitting chips are fixedly connected to the metal substrate directly, the connection between the light-emitting chips and the metal substrate may loosen due to the frequent expansion or shrinkage of the light-emitting chips, or worse, the light-emitting chips may fall off from the metal substrate. By fixedly connecting the light-emitting chips to the metal substrate by a heat sink, based on the principle that the expansion coefficient of the heat sink is proximate to the expansion coefficient of the light-emitting chips when being heated, the fixed connection between the light-emitting chips and the metal substrate is firmer and less likely to loosen.

In some embodiments of the present disclosure, the light-emitting chips are connected in series by means of electrical connection. For example, each light-emitting chip is connected with spun gold which is eventually connected to a pin. In this way, each light-emitting chip is powered on. In some embodiments, the spun gold is fixed on the metal substrate by gluing.

In some embodiments of the present disclosure, the laser array further includes a transparent protection layer, the transparent portion of which is arranged at light emitting sides of the light-emitting chips 203 and covers the light-emitting chips 203. An edge portion of the transparent protection layer is fixed onto the metal substrate, for example, by welding or gluing, to form a sealed space in which all the light-emitting chips are included, so as to protect the light-emitting chips. In some embodiments, the sealed space is filled with $N_2$ which may further protect the light-emitting chips.

In some embodiments, the relative position relation between the metal substrate, the reflective protrusion and the lasers is not limited by the wavelengths of the lasers.

Figure 16:
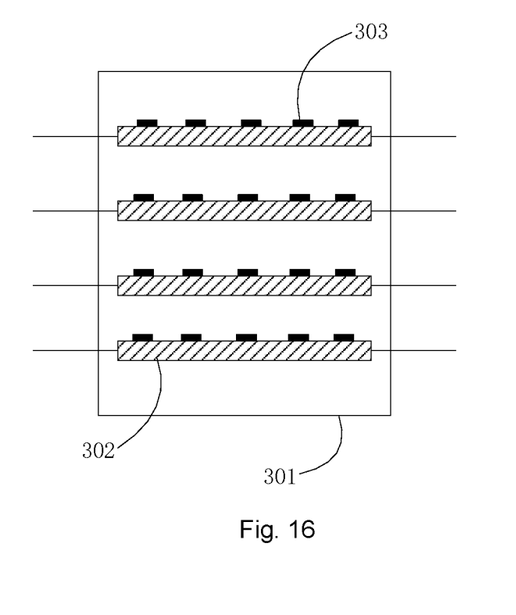
FIG. 16 shows a schematic structure diagram of still another laser array according to some embodiments of the present disclosure.

To improve the heat dissipation efficiency, some embodiments of the present disclosure provide a laser array of another structure. As shown in FIG. 16, the laser array includes a metal substrate 301, at least one metal strip 302 fixed on the metal substrate 301, and at least one light-emitting chip 303 which is fixedly connected to the at least one metal strip 302, and the light emitting direction of the light-emitting chip 303 faces away from the metal substrate 301.

In some embodiments, as shown in FIG. 16, the light-emitting chip 303 is fixed on a surface of the metal strip 302, and an opposite side of the metal strip 302 is fixed on the metal substrate 301.

In some embodiments, the at least one light-emitting chip 303 includes at least six light-emitting chips 303, and the at least one metal strip 302 includes at least two metal strips 302. Each metal strip 302 is fixedly connected to at least three light-emitting chips 303, and the interval between two adjacent light-emitting chips among the at least three light-emitting chips 303 is 1 mm to 10 mm. The metal strips 302, on which the light-emitting chips 303 are fixed, are fixedly connected to the metal substrate 301. The light emitting direction of each light-emitting chip 303 faces away from the metal substrate 301.

By directly connecting the light-emitting chips 303 with the metal strip 302 showing efficient heat dissipation performance, setting the interval between two adjacent light-emitting chips 303 to be 1 mm to 10 mm, and tightly fixing the at least two meal strips 302 to the metal substrate 301 having a large heat dissipation area, heat generated by the light-emitting chips may be quickly transferred and dissipated while ensuring the light-emitting brightness of the lasers. Furthermore, the production process of the laser array may be simplified, and the production cost may be thus reduced.

The number of light-emitting chips 303 and the number of metal strips 302 are not specifically limited, and may be increased or reduced according to the requirement on the light-emitting brightness. For example, the at least one metal strips 302 includes four metal strips 302, and five light-emitting chips 303 are fixedly connected to each metal strip 302.

The way of fixed connection of the light-emitting chips 203 and the metal strips 302 and the way of fixed connection of the metal strips 302 and the metal substrate 301 are not specifically limited as long as this connection way will not significantly influence the heat conduction. In some examples, the light-emitting chips 303 and the metal strips 302 are fixed by welding. In some examples, the light-emitting chips 303 and the metal strips 302 are fixed by bonding by using a thermal conductive adhesive.

In some embodiments of the present disclosure, the metal strips 302 are copper strips. The shapes of the copper strips are not limited as long as they can be firmly fixed on the metal substrate and light-emitting chips can be firmly fixed on the copper strips. For example, the copper strips are rectangular copper strips. In some embodiments of the present disclosure, the metal substrate 301 is a copper substrate. In some examples, the copper substrate has a thickness of 1 mm to 3 mm. In some embodiments, the copper strips are arranged in parallel on the copper substrate, with an interval of 3 mm to 10 mm between adjacent copper strips.

Figure 17:
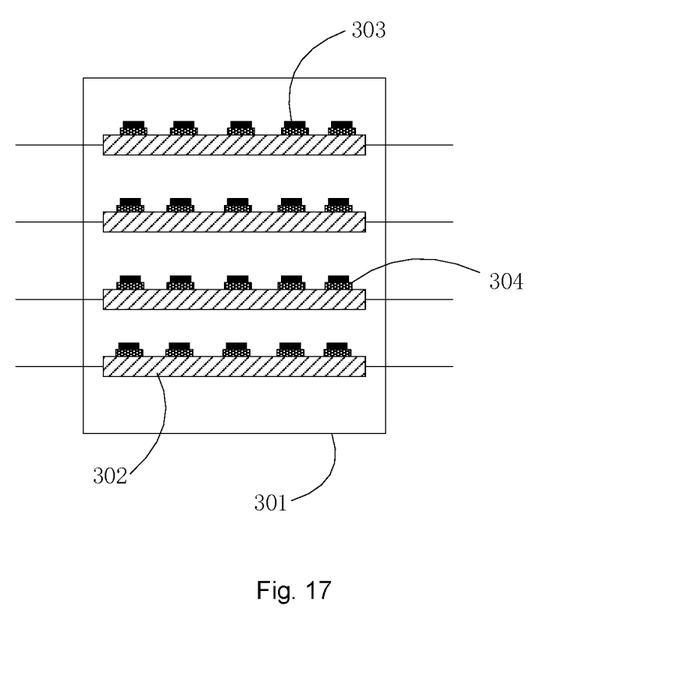
FIG. 17 shows a schematic structure diagram of yet another laser array according to some embodiments of the present disclosure.

In some embodiments of the present disclosure, as shown in FIG. 17, the light-emitting chips 303 are fixedly connected to the metal strips 302 by a heat sink 304. For example, first, the light-emitting chips 303 are fixedly connected to one surface of the heat sink 304 by welding or by bonding by using a thermal conductive adhesive, and then an opposite surface of the heat sink 304 is fixedly connected to the metal strips 302 by welding or by bonding by using a thermal conductive adhesive.

The way of fixed connection of the light-emitting chips 203 and the heat sink 304 and the way of fixed connection of the heat sink 304 and the metal strips 302 are not specifically limited as long as this connection way will not significantly influence the heat conduction. For example, the fixed connection is realized by welding. Alternatively, the fixed connection is realized by bonding by using a thermal conductive adhesive. The heat sink is made of, for example, AlN or SiC or the like. Since a large amount of heat will be generated when the light-emitting chips operate so that the light-emitting chips themselves will expand with heat, if the light-emitting chips are fixedly connected to the metal strips directly, the connection between the light-emitting chips and the metal strips may loosen due to the frequent expansion or shrinkage of the light-emitting chips, or worse, the light-emitting chips may fall off from the metal strips. By fixedly connecting the light-emitting chips to the metal strips by heat sinks, based on the principle that the expansion coefficient of the heat sinks is proximate to the expansion coefficient of the light-emitting chips when being heated, the fixed connection between the light-emitting chips and the metal strips is firmer and less likely to loosen.

In some embodiments of the present disclosure, the light-emitting chips 303 are connected in series by means of electrical connection. For example, each light-emitting chip 303 is connected with spun gold which is eventually connected to a pin. In this way, each light-emitting chip is powered on. In some embodiments, the spun gold is fixed on the metal substrate by gluing.

In some embodiments of the present disclosure, the laser array further includes a transparent protection layer, the transparent portion of which is arranged at light emitting sides of the light-emitting chips 203 and covers the light-emitting chips 203. An edge portion of the transparent protection layer is fixed onto the metal substrate, for example, by welding or gluing, to form a sealed space. All the light-emitting chips are included in the sealed space, so as to protect the light-emitting chips. In some embodiments, the sealed space is filled with $N_2$ which may further protect the light-emitting chips.

In some embodiments, the relative position relation between the metal substrate, the metal strips and the lasers is not limited by the wavelengths of the lasers.

Figure 18:
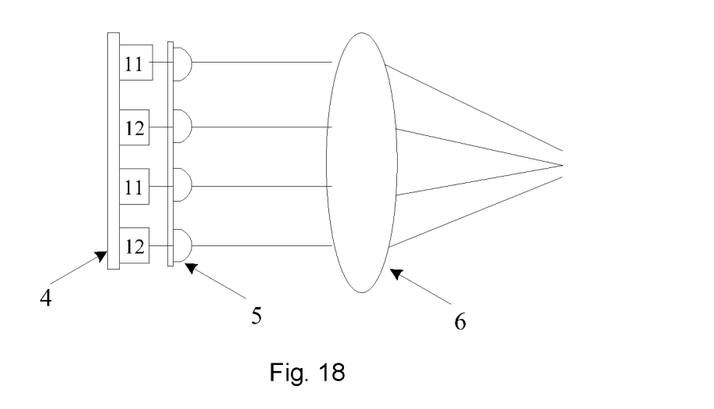
FIG. 18 shows a schematic view of framework of a laser light source according to some embodiments of the present disclosure.

Some embodiments of the present disclosure further provide a laser light source. As shown in FIG. 18, the laser light source includes the laser array 4 described in the foregoing embodiments, at least one collimating lens set 5 and at least one converging lens set 6. The laser array 4 refers to the description of the foregoing embodiments and will not be repeated here. The at least one collimating lens set 5 is configured to collimate laser beam emitted by the laser array 4, and then the collimated laser beam is transferred to the converging lens set 6. The at least one converging lens set 6 is configured to converge the collimated laser beam.

Figure 19:
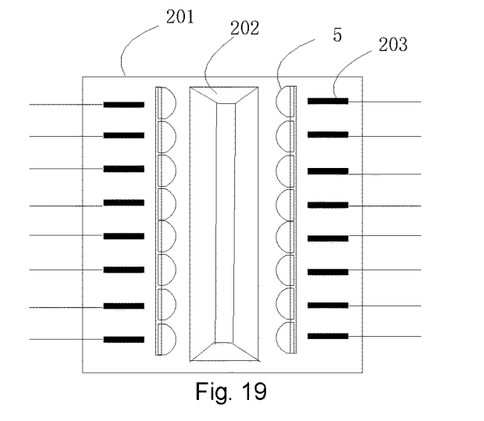
FIG. 19 shows a schematic view of a collimating lens set according to some embodiments of the present disclosure.

Due to different structures of the laser array 4, there are various ways for the arrangement of the at least one collimating lens set 5. In some embodiments of the present disclosure, as shown in FIG. 19, the number of the at least one collimating lens set 5 is the same as that of the light-emitting chips 203, so as to collimate light beams emitted by the light-emitting chips 203. In some examples, each collimating lens set 5 corresponds to one light-emitting chip 203. The collimating lens sets 5 are arranged at the light emitting side of the light-emitting chip 203 (i.e., between the light-emitting chip 203 and the reflective protrusion 202). In other examples, the collimating lens set 5 is arranged at the light outgoing side of the reflective protrusion 202. In some examples, the collimating lens sets 5 are integrally manufactured and are arranged at the light emitting side of the light-emitting chips 203 or the light outgoing side of the reflective protrusion 202. In other examples, each of the collimating lens sets 5 is arranged separately to and is independently arranged at the light emitting side of a corresponding light-emitting chip 203 or the light outgoing side of the reflective protrusion 202.

Figure 20:
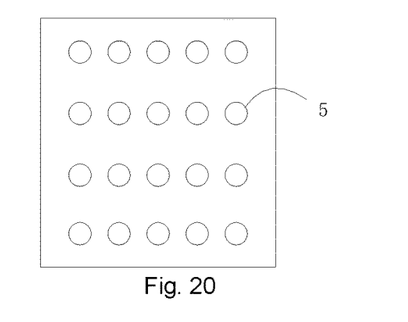
FIG. 20 shows a schematic view of another collimating lens set according to some embodiments of the present disclosure.

In some embodiments of the present disclosure, as shown in FIG. 20, the number of collimating lens sets 5 is the same as that of the light-emitting chips 303, and each collimating lens set 5 corresponds to one light-emitting chip 303 and is arranged at the light emitting side of this light-emitting chip to collimate light beams emitted by the light-emitting chip 303. In some examples, the at least one collimating lens sets 5 are integrally manufactured and are arranged at the light emitting side of the light-emitting chips. In other examples, each of the at least one the collimating lens set 5 is arranged separately and is independently arranged at the light emitting side of the light-emitting chips 303. This case corresponds to, for example, a case where the laser array includes at least one metal strip 302.

Figure 21:
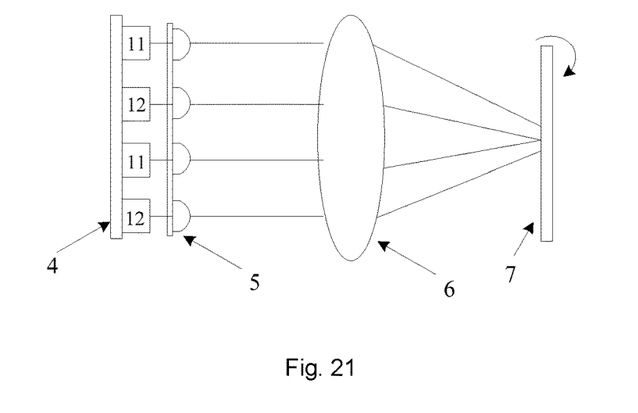
FIG. 21 shows a schematic view of framework of another laser light source according to some embodiments of the present disclosure.

In some embodiments of the present disclosure, as shown in FIG. 21, the laser light source further includes a diffuser component 7. The diffuser component 7 is arranged on the light outgoing path of the converging lens set 6 to diffuse laser beams from the converging lens set 6. Meanwhile, the diffuser component 7 vibrates, when being driven, to further enhance the diffusion effect. Laser beams emitted from the laser array 4 are temporally averaged by the diffuser component, more random speckle patterns may be generated within the viewing time by human eyes, and the superposition of more speckle patterns may obtain better speckle cancellation effect.

Figure 22:
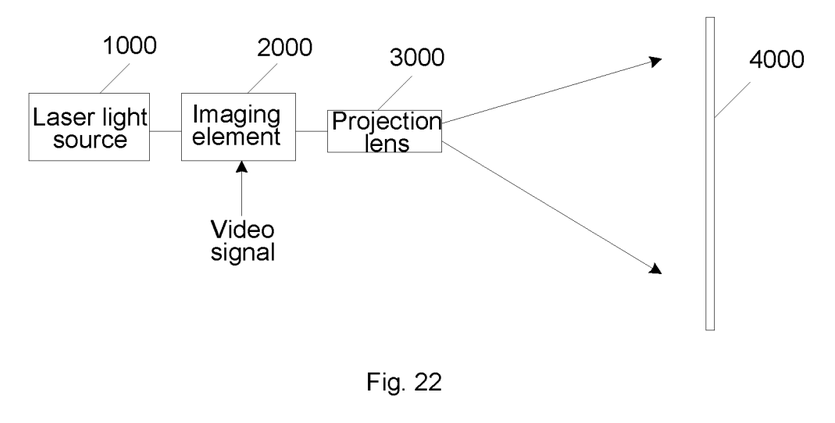
FIG. 22 shows a schematic view of framework of a laser projection device according to some embodiments of the present disclosure.

Some embodiments of the present disclosure provide a laser projection device. As shown in FIGS. 21 and 22, the laser projection device includes a laser light source 1000, an imaging element 2000 and a projection lens 3000. The imaging element 2000 is configured to receive a laser beam emitted by the laser light source 1000 and generate a projection light beam according to a received video signal. The projection lens 3000 is configured to project the projection light beam onto a display surface 4000 to display an image. The laser light source 1000 includes a laser array 4, at least one collimating lens set 5 and at least one converging lens set 6. The laser array 4 includes at least one line of lasers which includes a first laser and a second laser which are adjacent. A first laser beam emitted by the first laser and a second laser beam emitted by the second laser are both in a first color, and the first laser beam has a wavelength less than that of the second laser beam. The at least one collimating lens set 5 is configured to collimate, as collimated laser beams, laser beams emitted from the laser array, and the at least one converging lens set 6 is configured to converge the collimated laser beams. The laser array 4, the at least one collimating lens set 5 and the at least one converging lens set 6 refer to the above related description, which are not repeated.

In some embodiments of the present disclosure, the imaging element 200 can be a DMD (digital micromirror device) element or a LCOS (Liquid Crystal on Silicon) element.

In the descriptions of the specification, specific features, structures, materials or characteristics can be combined appropriately in any one or more embodiments or examples.

The abstract of the present disclosure is provided to allow readers to determine the essence of the present disclosure quickly. It should be understood that the abstract is not used to explain or limit the scope or meaning of the claims. In addition, it may be known from the foregoing description that, to simplify the present disclosure, various features are grouped in the embodiments. This disclosure method should not be interpreted as the following intention: more features than those recorded in each embodiment are claimed in the claims. Instead, as reflected by the appended claims, an object of the present disclosure is to reduce all features in a single disclosed embodiment. Therefore, the appended claims are incorporated in the detailed description and each claim itself is used as a subject to be protected separately.

The foregoing descriptions merely show specific implementations of the present disclosure, and the protection scope of the present disclosure is not limited thereto. Any person of skill in the art can readily conceive of variations or replacements within the technical scope disclosed by the embodiments of the present disclosure, and these variations or replacements shall fall into the protection scope of the present disclosure. Accordingly, the protection scope of the present disclosure shall be subject to the protection scope defined by the claims.

What is claimed is:

1. A laser array comprising:
at least one line of lasers, the at least one line of lasers comprising at least two first lasers, a second laser, a fourth laser and a fifth laser, wherein the second laser is positioned between two of the at least two first lasers, and the fourth laser is adjacent to the fifth laser;
wherein the at least two first lasers are configured to emit a first laser beam, and the second laser are configured to emit a second laser beam;
wherein the fourth laser is configured to emit a fourth laser beam, the fifth laser is configured to emit a fifth laser beam;
wherein the first laser beam and the second laser beam are both within wavelengths of a first color, and wherein a first wavelength of the first laser beam is less than a second wavelength of the second laser beam; and
wherein the fourth laser beam and the fifth laser beam are both within wavelengths of a second color, and the second color being different from the first color, wherein a fourth wavelength of the fourth laser beam is less than a fifth wavelength of the fifth laser beam.

2. The laser array according to claim 1, wherein the at least two first lasers and the second laser are arranged in a same line in which at least two first lasers and at least two second lasers are arranged, one of the at least two first lasers is positioned between two adjacent ones of the at least two second lasers, and one of the at least two second lasers is positioned between two adjacent ones of the at least two first lasers.

3. The laser array according to claim 1, wherein:
the at least one line of lasers further comprises a third laser configured to emit a third laser beam;
the third laser beam is within wavelengths of the first color, and a third wavelength of the third laser beam is greater than the second wavelength of the second laser beam; and
the third laser is positioned adjacent to one of the at least two first lasers or the second lasers.

4. The laser array according to claim 1, wherein the fourth laser and the fifth laser are arranged in a same line in which at least two fourth lasers and at least two fifth lasers are arranged, one of the at least two fourth lasers is positioned between two adjacent ones of the at least two fifth lasers, and one of the at least two fifth lasers is positioned between two adjacent ones of the at least two fourth lasers.

5. The laser array according to claim 1, wherein:
the at least one line of lasers further comprises a sixth laser configured to emit a sixth laser beam;
the sixth laser beam is within wavelengths of the second color;
a sixth wavelength of the sixth laser beam is greater than the fifth wavelength of the fifth laser beam; and
the sixth laser is positioned adjacent to at least one of the fourth laser or the fifth laser.

6. The laser array according to claim 1, wherein:
the at least one line of lasers further comprises a seventh laser and an eighth laser, wherein the seventh laser is positioned adjacent to the eighth laser;
the seventh laser is configured to emit a seventh laser beam, the eighth laser is configured to emit an eighth laser beam;
the seventh laser beam and the eighth laser beam are both within wavelengths of a third color, the third color being different from both the first color and the second color; and
a seventh wavelength of the seventh laser beam is less than an eight wavelength of the eighth laser beam.

7. The laser array according to claim 6, wherein the seventh laser and the eighth laser are arranged in a same line in which at least two seventh lasers and at least two eighth lasers are arranged, one of the at least two seventh lasers is positioned between two adjacent ones of the at least two eighth lasers, and one of the at least two eighth lasers is positioned two adjacent ones of between the at least two seventh.

8. The laser array according to claim 6, wherein the at least one line of lasers further comprises a ninth laser configured to emit a ninth laser beam; and
wherein the ninth laser beam emitted by the ninth laser is within wavelengths of the third color, and a ninth wavelength of the ninth laser beam is greater than the eighth wavelength of the eighth laser beam, and the ninth laser is positioned adjacent to at least one of the seventh laser or the eighth laser.

9. The laser array according to claim 6, wherein the first color is blue, the second color is red, and the third color is green.

10. The laser array according to claim 1, wherein each laser in the at least one line of lasers comprises a light-emitting chip.

11. The laser array according to claim 10, further comprising a metal substrate and a reflective protrusion, wherein the at least one line of lasers comprises at least six light-emitting chips; and wherein:
the reflective protrusion and the at least six light-emitting chips are fixedly connected to the metal substrate;
each light-emitting chip is configured to emit light towards the reflective protrusion; and
the reflective protrusion is configured to reflect the light towards a direction opposite to the metal substrate.

12. The laser array according to claim 11, wherein a top surface of the reflective protrusion away from the metal substrate has an area less than that of a bottom surface of the reflective protrusion joined with the metal substrate.

13. The laser array according to claim 11, wherein the at least one line of lasers comprises a plurality of lines of light-emitting chips, the reflective protrusion comprises a plurality of side surfaces, and each line of light-emitting chips corresponds to a corresponding one of the plurality of side surfaces.

14. A laser projection device, comprising:
a laser light source;
an imaging element configured to receive a laser beam emitted by the laser light source and generate a projection beam according to a received video signal;
a projection lens configured to project the projection beam onto a display surface to display an image;
wherein, the laser light source comprises:
a laser array comprising at least one line of lasers, wherein the at least one line of lasers comprises at least two first lasers, a second laser, a fourth laser and a fifth laser, wherein the second laser is positioned between the two first lasers, and the fourth laser is adjacent to the fifth laser;

wherein the at least two first lasers are configured to emit a first laser beam, and the second laser are configured to emit a second laser beam;

wherein the fourth laser is configured to emit a fourth laser beam, the fifth laser is configured to emit a fifth laser beam;

wherein the first laser beam and the second laser beam are both within wavelengths of a first color, and wherein a first wavelength of the first laser beam is less than a second wavelength of the second laser beam;

wherein the fourth laser beam and the fifth laser beam are both within wavelengths of a second color, and the second color being different from the first color, wherein a fourth wavelength of the fourth laser beam is less than a fifth wavelength of the fifth laser beam;

at least one collimating lens set configured to collimate laser beams emitted from the laser array into collimated laser beams; and at least one converging lens set configured to converge the collimated laser beams.

15. The laser projection device according to claim 14, wherein each laser in the line of lasers comprises a light-emitting chip; and each of the at least one collimating lens set is correspondingly arranged at a light emitting side of each light-emitting chip.

16. The laser projection device according to claim 14, wherein each laser in the at least one line of lasers comprises a light-emitting chip; and the laser array further comprises a metal substrate and a metal strip, wherein light-emitting chips are fixedly connected to the metal strip, and wherein the light-emitting chips are configured to emit light in a direction away from the metal substrate.

17. A laser array comprising:

at least one line of lasers, wherein the at least one line of lasers comprises at least a first laser, a second laser, a fourth laser and a fifth laser, the first laser is positioned adjacent to the second laser, and the fourth laser is adjacent to the fifth laser;

a first laser beam emitted by the first laser and a second laser beam emitted by the second laser are both in a first color, a fourth laser beam emitted by the fourth laser and a fifth laser beam emitted by the fifth laser are both in a second color, and the second color being different from the first color; a first wavelength of the first laser beam is less than a second wavelength of the second laser beam, and a fourth wavelength of the fourth laser beam is less than a fifth wavelength of the fifth laser beam; each laser in the at least one line of lasers comprises a light-emitting chip;

a metal substrate; and at least one metal strip fixed on the metal substrate, wherein light-emitting chips are fixedly connected to the at least one metal strip, and the light-emitting chips are configured to emit light in a direction away from the metal substrate.

18. A laser array comprising:

a line of lasers, wherein each laser of the line of lasers comprises a light-emitting chip;

wherein the line of lasers comprises a first laser, a second laser, a fourth laser and a fifth laser, the first laser is positioned adjacent to the second laser, the fourth laser is adjacent to the fifth laser;

wherein the first laser is configured to emit a first laser beam, the second laser is configured to emit a second laser beam, the fourth laser is configured to emit a fourth laser beam, the fifth laser is configured to emit a fifth laser beam; and wherein the first laser beam and the second laser beam are both within wavelengths of a blue color, the fourth laser beam and the fifth laser beam are both within wavelengths of a red color, and;

wherein a first wavelength of the first laser beam is less than a second wavelength of the second laser beam, a fourth wavelength of the fourth laser beam is less than a fifth wavelength of the fifth laser beam;

a metal substrate; and a metal strip fixed on the metal substrate, wherein, the light-emitting chip is fixedly connected to the metal strip, and the light-emitting chips are configured to emit light in a direction away from the metal substrate.

19. The laser array according to claim 18, wherein the metal strip includes a first surface facing and attached to the metal substrate, a second surface facing away from the metal substrate opposite to the first surface, and a side surface that is provided between the first surface to the second surface, and wherein the light emitting chip is disposed on the side surface of the metal strip.

* * * * *